United States Patent
Tanaka et al.

(10) Patent No.: US 9,443,989 B2
(45) Date of Patent: Sep. 13, 2016

(54) MANUFACTURING METHOD OF SEMICONDUCTOR FILM, MANUFACTURING METHOD OF SEMICONDUCTOR DEVICE, AND MANUFACTURING METHOD OF PHOTOELECTRIC CONVERSION DEVICE

(75) Inventors: Tetsuhiro Tanaka, Kanagawa (JP); Erika Kato, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 613 days.

(21) Appl. No.: 13/172,359

(22) Filed: Jun. 29, 2011

(65) Prior Publication Data
US 2012/0003787 A1    Jan. 5, 2012

(30) Foreign Application Priority Data
Jul. 2, 2010 (JP) .................................. 2010-151644

(51) Int. Cl.
*H01L 21/336* (2006.01)
*H01L 29/786* (2006.01)
(Continued)

(52) U.S. Cl.
CPC ..... *H01L 29/78696* (2013.01); *H01L 21/0262* (2013.01); *H01L 21/02532* (2013.01); *H01L 21/02576* (2013.01); *H01L 21/02592* (2013.01); *H01L 29/04* (2013.01); *H01L 29/66765* (2013.01); *H01L 31/0304* (2013.01); *H01L 31/0376* (2013.01); *H01L 31/03685* (2013.01); *H01L 31/03687* (2013.01);
(Continued)

(58) Field of Classification Search
CPC .............. H01L 21/02532; H01L 21/2576; H01L 21/02592; H01L 21/0262; H01L 29/04; H01L 29/66775; H01L 29/78696; H01L 29/78648
USPC ......................................... 438/96, 485, 157
See application file for complete search history.

(56) References Cited

U.S. PATENT DOCUMENTS 4,409,134 A   10/1983   Yamazaki
4,504,518 A   3/1985    Ovshinsky et al.
(Continued)

FOREIGN PATENT DOCUMENTS

EP   0 727 826 A2   8/1996
EP   2 037 721 A1   3/2009
(Continued)

OTHER PUBLICATIONS

Campbell, S.A., *The Science and Engineering of Microelectronic Fabrication*, 2nd edition, 2001, p. 306, Oxford University Press.
(Continued)

*Primary Examiner* — Savitr Mulpuri
(74) *Attorney, Agent, or Firm* — Husch Blackwell LLP

(57) ABSTRACT

A method for forming an amorphous semiconductor which contains an impurity element and has low resistivity and a method for manufacturing a semiconductor device with excellent electrical characteristics with high yield are provided. In the method for forming an amorphous semiconductor containing an impurity element, which utilizes a plasma CVD method, pulse-modulated discharge inception voltage is applied to electrodes under the pressure and electrode distance with which the minimum discharge inception voltage according to Paschen's Law can be obtained, whereby the amorphous semiconductor which contains an impurity element and has low resistivity is formed.

6 Claims, 10 Drawing Sheets

(51) Int. Cl.
- *H01L 21/02* (2006.01)
- *H01L 29/04* (2006.01)
- *H01L 29/66* (2006.01)
- *H01L 31/0304* (2006.01)
- *H01L 31/0368* (2006.01)
- *H01L 31/0376* (2006.01)
- *H01L 31/072* (2012.01)
- *H01L 31/0735* (2012.01)
- *H01L 31/113* (2006.01)
- *H01L 31/18* (2006.01)
- *H01L 31/20* (2006.01)

(52) U.S. Cl.
CPC .. *H01L 31/03762* (2013.01); *H01L 31/03765* (2013.01); *H01L 31/072* (2013.01); *H01L 31/0735* (2013.01); *H01L 31/1136* (2013.01); *H01L 31/1808* (2013.01); *H01L 31/1812* (2013.01); *H01L 31/1816* (2013.01); *H01L 31/1824* (2013.01); *H01L 31/1852* (2013.01); *H01L 31/202* (2013.01); *H01L 29/78648* (2013.01); *Y02E 10/544* (2013.01); *Y02E 10/545* (2013.01); *Y02E 10/548* (2013.01)

(56) References Cited

U.S. PATENT DOCUMENTS

| | | |
|---|---|---|
| 5,231,048 A | 7/1993 | Guha et al. |
| 5,525,813 A | 6/1996 | Miyake et al. |
| 5,618,758 A | 4/1997 | Tomita et al. |
| 6,009,828 A | 1/2000 | Tomita et al. |
| 6,171,674 B1 * | 1/2001 | Yamazaki et al. ........... 428/64.4 |
| 6,709,901 B1 | 3/2004 | Yamazaki et al. |
| 6,779,482 B2 * | 8/2004 | Sakai et al. ............... 118/723 E |
| 6,855,957 B1 | 2/2005 | Yamazaki et al. |
| 7,492,028 B2 | 2/2009 | Nishi et al. |
| 7,883,750 B2 * | 2/2011 | Saito et al. .................... 427/569 |
| 7,927,981 B2 * | 4/2011 | Imaeda et al. ................. 438/485 |
| 8,067,775 B2 | 11/2011 | Miyairi et al. |
| 8,637,866 B2 | 1/2014 | Isa et al. |
| 2002/0056415 A1 * | 5/2002 | Mashima et al. ......... 118/723 E |
| 2004/0075396 A1 | 4/2004 | Okumura et al. |
| 2004/0137647 A1 * | 7/2004 | Miyazaki et al. ................ 438/3 |
| 2006/0213865 A1 * | 9/2006 | Honda et al. ................... 216/67 |
| 2007/0207574 A1 | 9/2007 | Wang et al. |
| 2009/0183771 A1 | 7/2009 | Sannomiya et al. |
| 2009/0321737 A1 | 12/2009 | Isa et al. |
| 2010/0059749 A1 | 3/2010 | Takahashi et al. |
| 2010/0124804 A1 | 5/2010 | Takahashi et al. |
| 2012/0061668 A1 | 3/2012 | Miyairi et al. |

FOREIGN PATENT DOCUMENTS

| | | |
|---|---|---|
| JP | 07-502625 | 3/1995 |
| JP | 08-288228 A | 11/1996 |
| JP | 2000-277439 | 10/2000 |
| JP | 2008-004813 A | 1/2008 |
| JP | 2008-004814 A | 1/2008 |
| JP | 2008-004815 A | 1/2008 |
| JP | 2008-182055 A | 8/2008 |
| JP | 2009-252814 A | 10/2009 |
| JP | 2010-87491 | 4/2010 |
| JP | 2010-123938 A | 6/2010 |
| TW | I295855 | 4/2008 |
| WO | WO 93/13553 A1 | 7/1993 |
| WO | WO 2009/157574 A1 | 12/2009 |
| WO | WO 2010/047217 A1 | 4/2010 |

OTHER PUBLICATIONS

Taiwanese Office Action re Application No. TW 100122000, dated Dec. 29, 2015.

* cited by examiner

MANUFACTURING METHOD OF SEMICONDUCTOR FILM, MANUFACTURING METHOD OF SEMICONDUCTOR DEVICE, AND MANUFACTURING METHOD OF PHOTOELECTRIC CONVERSION DEVICE

BACKGROUND OF THE INVENTION

1. Field of the Invention

The present invention relates to a manufacturing method of an amorphous semiconductor film containing an impurity element, manufacturing methods of a semiconductor device and a photoelectric conversion device which include the amorphous semiconductor film containing an impurity element, and a display device.

2. Description of the Related Art

As one type of field-effect transistor, a thin film transistor whose channel region is formed using a semiconductor film which is formed over a substrate having an insulating surface is known. A technique in which amorphous silicon, microcrystalline silicon, or polycrystalline silicon is used for a semiconductor film in which a channel region of a thin film transistor is formed has been disclosed (Patent Document 1). A typical application of a thin film transistor is a liquid crystal television device, in which the thin film transistor has been put to practical use as a switching transistor in each pixel constituting a display screen.

A photoelectric conversion device has been developed in which microcrystalline silicon, which is crystalline silicon capable of being formed by a plasma CVD method, is used for a semiconductor film having a function of photoelectric conversion (e.g., Patent Document 2).

An inverted-staggered thin film transistor includes an ohmic contact region which is formed using an impurity semiconductor between a semiconductor film and a wiring. A pin photoelectric conversion device includes a p-type semiconductor film containing an impurity element imparting p-type conductivity and an n-type semiconductor film containing an impurity element imparting n-type conductivity.

REFERENCE

[Patent Document 1] Japanese Published Patent Application No. 2010-87491
[Patent Document 2] Japanese Published Patent Application No. 2000-277439

SUMMARY OF THE INVENTION

In the case where the resistivity of a semiconductor film in a thin film transistor or a photoelectric conversion device is low, the resistivity of an ohmic contact region, a p-type semiconductor film, or an n-type semiconductor film affects the electrical characteristics of the thin film transistor or the photoelectric conversion device.

For that reason, a microcrystalline semiconductor with low resistivity may be used in the ohmic contact region, the p-type semiconductor film, or the n-type semiconductor film. However, when a microcrystalline semiconductor is used, an etchant enters grain boundaries in the microcrystalline semiconductor in an etching step, which causes a reduction in yield.

In contrast, when an amorphous semiconductor film is used as the ohmic contact region, the p-type semiconductor film, or the n-type semiconductor film, the yield in an etching step can be increased. However, the resistivity of the amorphous semiconductor is higher than that of the microcrystalline semiconductor when the semiconductors are used in the ohmic contact region, the p-type semiconductor film, or the n-type semiconductor film. For that reason, it is preferable to perform deposition under high pressure or with low power, which causes less damage due to ion impact, in order to reduce the resistivity of the amorphous semiconductor film. However, uniform plasma cannot be maintained with voltage lower than discharge inception voltage.

In view of the above, an object of one embodiment of the present invention is to provide a manufacturing method of a semiconductor device with excellent electrical characteristics with high yield.

One embodiment of the present invention is a formation method of an amorphous semiconductor containing an impurity element, which utilizes a plasma CVD method. In the method, the amorphous semiconductor which contains an impurity element and has low resistivity is formed by applying pulse-modulated discharge inception voltage to electrodes under the pressure and electrode distance with which the minimum discharge inception voltage according to Paschen's Law can be obtained.

When discharge generated by application of discharge inception voltage to electrodes, that is, continuous discharge is performed, the discharge state is unstable. In contrast, when discharge generated by application of pulse-modulated voltage to electrodes, that is, pulse discharge is performed, the discharge state is stable. In addition, in the pulse discharge, the average voltage per pulse period is low and there is a period in which voltage is not applied; thus, damage due to ion impact to a deposition surface can be reduced. Thus, the resistivity of the amorphous semiconductor containing an impurity element can be reduced.

Another embodiment of the present invention is a manufacturing method of a semiconductor device. In the manufacturing method, a contact region is formed over a semiconductor film which overlaps with a gate electrode with a gate insulating layer interposed therebetween and is formed using an amorphous semiconductor or a microcrystalline semiconductor, by the formation method of the amorphous semiconductor containing an impurity element, and a wiring which is in contact with the contact region is formed.

Another embodiment of the present invention is a manufacturing method of a photoelectric conversion device in which the amorphous semiconductor containing an impurity element is used in one or both of the p-type and n-type semiconductor films.

According to one embodiment of the present invention, an amorphous semiconductor which contains an impurity element and has low resistivity can be formed by applying pulse-modulated discharge inception voltage to electrodes under the pressure and electrode distance with which the minimum discharge inception voltage according to Paschen's Law can be obtained. Moreover, a semiconductor device with excellent electrical characteristics can be manufactured with high productivity.

DETAILED DESCRIPTION OF THE INVENTION

Figure 1A:
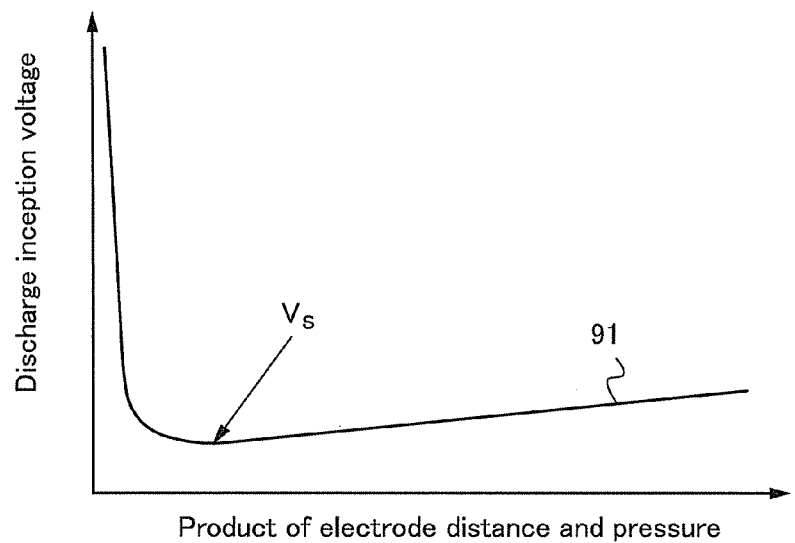
FIGS. 1A and 1B are graphs illustrating a manufacturing method of a semiconductor film according to one embodiment of the present invention.

Hereinafter, Embodiments and Example of the present invention will be described with reference to the drawings. However, the present invention is not limited to the following description. It is easily understood by those skilled in the art that the mode and detail can be changed in various ways without departing from the spirit and scope of the present invention. Therefore, the present invention is not construed as being limited to the following description of Embodiments and Example. Note that reference numerals denoting the same portions are commonly used in different drawings.

Embodiment 1

In this embodiment, a manufacturing method of an amorphous semiconductor film which contains an impurity element and has low resistivity will be described with reference to FIGS. 1A and 1B.

Figure 1B:
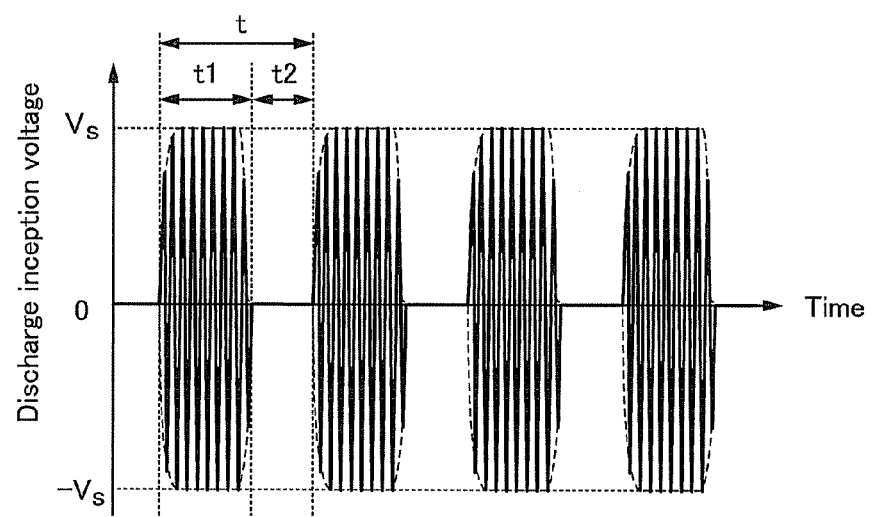

A curve 91 in FIG. 1A is the Paschen curve according to Paschen's Law. In FIG. 1A, the horizontal axis indicates the product of the electrode distance of a plasma CVD apparatus and the pressure in a reaction chamber of the plasma CVD apparatus, and the vertical axis indicates the voltage at which glow discharge is generated (hereinafter, the discharge inception voltage). The discharge inception voltage is represented by the relationship between electrode distance and pressure as in Formula 1. When the pressure in the reaction chamber is low, discharge can be generated by increasing the electrode distance; when the pressure in the reaction chamber is high, discharge can be generated by decreasing the electrode distance.

$$V_s = \frac{Bpd}{\ln\frac{Apd}{\ln(1+1/\gamma)}} = f(pd) \quad [\text{FORMULA 1}]$$

Note that p represents the pressure in a reaction chamber; d, the electrode distance; γ, the secondary electron emission coefficient (that is dependent on the work function of an electrode material); and A and B, the constants that are dependent on the kind of gas.

In this embodiment, a deposition gas containing silicon or germanium and a gas containing an impurity element are supplied as source gases to a reaction chamber in which the electrode distance and pressure with which the minimum discharge inception voltage $V_s$ can be obtained are maintained, and then pulse-modulated minimum discharge inception voltage is applied to electrodes. Note that the minimum discharge inception voltage $V_s$ includes the minimum value of the discharge inception voltage in the Paschen curve and a value within the error range of ±10% from the minimum value of the discharge inception voltage. In the case where high-frequency discharge or microwave discharge is used, the minimum discharge inception power may be applied to the electrodes. If the impedance between the electrodes is the same, the discharge inception voltage is proportional to the square of the voltage between the electrodes. In other words, it can be understood that the square root of the power is substantially proportional to the applied voltage.

As typical examples of the deposition gas containing silicon, which is the source gas, there are $SiH_4$, $Si_2H_6$, and the like. As typical examples of the deposition gas containing germanium, there are $GeH_4$, $Ge_2H_6$, and the like. As the gas containing an impurity element, which is the source gas, phosphine (diluted with hydrogen or silane) is used in the case where an n-type amorphous semiconductor is formed, whereas diborane (diluted with hydrogen or silane) is used in the case where a p-type amorphous semiconductor is formed. Hydrogen and one or more of rare gases such as helium, argon, neon, krypton, and xenon may be added to the source gas.

It is preferable that the electrode distance and pressure which allow the discharge inception voltage to be minimum discharge inception voltage in the Paschen curve be used. The electrode distance is typically greater than or equal to 2 mm and less than or equal to 20 mm. The pressure is typically greater than or equal to 1.3 Pa and less than or equal to 13332 Pa (greater than or equal to 0.01 Torr and less than or equal to 100 Torr).

Now, pulse-modulated minimum discharge inception voltage is described with reference to FIG. 1B.

The pulse-modulated minimum discharge inception voltage is voltage that is periodically applied to the electrodes. As illustrated in FIG. 1B, a period (pulse width t1) in which voltage is applied and a period (off period t2) in which voltage is not applied are alternately repeated. Here, the sum of the pulse width t1 and the off period t2 is referred to as a pulse period t. The ratio of the pulse width t1 to the pulse period t is referred to as a duty ratio.

Here, glow discharge plasma can be generated by pulse-modulating high-frequency voltage with a frequency of 3 MHz to 30 MHz, typically 13.56 MHz or 27.12 MHz in the HF band, very-high-frequency voltage with a frequency of 30 MHz to approximately 300 MHz, typically 60 MHz in the VHF band, or high-frequency voltage with a microwave frequency of 1 GHz or higher and applying the pulse-modulated voltage to the electrodes. The high-frequency voltage is pulse-modulated at a frequency higher than or equal to 1 kHz and lower than or equal to 12.5 kHz.

The pulse width t1 preferably has the length of time that allows a film to be deposited: the pulse width t1 is typically longer than or equal to 10 microseconds and shorter than or equal to 30 microseconds, preferably longer than or equal to 15 microseconds and shorter than or equal to 30 microseconds. The off period t2 preferably has the length of time that allows glow discharge to be maintained even when voltage is not applied: the off period t2 is typically longer than or equal to 70 microseconds and shorter than or equal to 990 microseconds, preferably longer than or equal to 70 microseconds and shorter than or equal to 490 microseconds.

When glow discharge is generated by continuously applying the minimum discharge inception voltage to electrodes in order to reduce damage due to ion impact to a deposition surface, discharge state becomes unstable and a uniform discharge state cannot be obtained. In contrast, when glow discharge is generated by continuously applying voltage higher than the minimum discharge inception voltage to electrodes, stable discharge can be obtained. In that case, however, the resistivity of an amorphous semiconductor film containing an impurity element is increased.

In view of the above, as in this embodiment, glow discharge is generated by applying pulse-modulated discharge inception voltage to electrodes under the electrode distance and pressure in a reaction chamber with which the discharge inception voltage has a minimum value or a value close thereto (minimum discharge inception voltage) in the Paschen curve. As a result, the average voltage per pulse period is lower than the discharge inception voltage; thus, damage due to ion impact to a deposition surface can be reduced and uniform discharge can be obtained. The reduction in the damage due to ion impact to the deposition surface results in a reduction in defects which trap carriers in an amorphous semiconductor film containing an impurity element. Thus, an amorphous semiconductor film which contains an impurity element and has low resistivity can be formed.

Embodiment 2

In this embodiment, a manufacturing method of a thin film transistor formed in a semiconductor device that is one embodiment of the present invention will be described with reference to FIGS. 2A to 2C, FIGS. 3A and 3B, and FIGS. 4A to 4C. Note that an n-channel thin film transistor has higher carrier mobility than a p-channel thin film transistor. Further, all thin film transistors formed over one substrate preferably have the same polarity, in which case the number of manufacturing steps can be reduced. Therefore, in this embodiment, a manufacturing method of an n-channel thin film transistor will be described.

Note that on-state current means current which flows between a source electrode and a drain electrode when a thin film transistor is on. For example, in the case of an n-channel thin film transistor, on-state current corresponds to current which flows between a source electrode and a drain electrode when the gate voltage is higher than the threshold voltage of the thin film transistor.

In addition, off-state current means current which flows between a source electrode and a drain electrode when a thin film transistor is off. For example, in the case of an n-channel thin film transistor, off-state current corresponds to current which flows between a source electrode and a drain electrode when the gate voltage is lower than the threshold voltage of the thin film transistor.

Figure 2A:
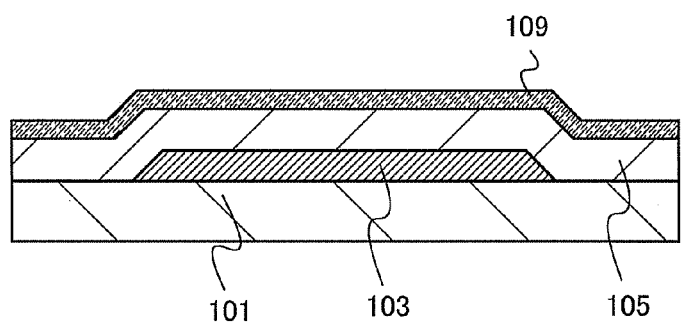
FIGS. 2A to 2C are cross-sectional views illustrating a manufacturing method of a semiconductor device according to one embodiment of the present invention.

As illustrated in FIG. 2A, a gate electrode 103 is formed over a substrate 101. Then, a gate insulating film 105 which covers the gate electrode 103 (also referred to as a first gate electrode) is formed, and a microcrystalline semiconductor film 109 is formed over the gate insulating film 105.

As the substrate 101, a glass substrate; a ceramic substrate; a plastic substrate which has heat resistance high enough to withstand the process temperature of this manufacturing process; or the like can be used. In the case where the substrate does not need to have a light-transmitting property, a metal substrate, such as a stainless steel alloy substrate, provided with an insulating film on its surface may be used. Note that there is no limitation on the size of the substrate 101. For example, any of glass substrates of the 3rd to 10th generations which are often used in the field of flat panel displays can be used.

The gate electrode 103 can be formed as a single layer or a stacked layer using a metal material such as molybdenum, titanium, chromium, tantalum, tungsten, aluminum, copper, neodymium, scandium, or nickel or an alloy material containing any of these materials as its main component. A semiconductor typified by polycrystalline silicon doped with an impurity element such as phosphorus, an AgPdCu alloy, an Al—Nd alloy, an Al—Ni alloy, or the like may also be used.

For example, the following structure is preferable as a two-layer structure of the gate electrode 103: a two-layer structure in which a molybdenum film is stacked over an aluminum film; a two-layer structure in which a molybdenum film is stacked over a copper film; a two-layer structure in which a titanium nitride film or a tantalum nitride film is stacked over a copper film; a two-layer structure in which a titanium nitride film and a molybdenum film are stacked; a two-layer structure in which a copper-magnesium alloy film containing oxygen and a copper film are stacked; a two-layer structure in which a copper-manganese alloy film containing oxygen and a copper film are stacked; a two-layer structure in which a copper-manganese alloy film and a copper film are stacked; and the like. As a three-layer structure, it is preferable to stack a tungsten film or a tungsten nitride film, an alloy film of aluminum and silicon or an alloy film of aluminum and titanium, and a titanium nitride film or a titanium film. By stacking a metal film functioning as a barrier film over a film having low electric resistance, electric resistance can be reduced and diffusion of a metal element from the metal film into the semiconductor film can be prevented.

The gate electrode 103 can be formed in the following manner: a conductive film is formed over the substrate 101 using the above material by a sputtering method or a vacuum evaporation method; a mask is formed over the conductive film by a photolithography method, an inkjet method, or the like; and the conductive film is etched using the mask. Alternatively, the gate electrode 103 can be formed by discharging a conductive nanopaste of silver, gold, copper, or the like over the substrate by an inkjet method and baking the conductive nanopaste. In order to improve the adhesion between the gate electrode 103 and the substrate 101, a film of a nitride of any of the above metal materials may be provided between the substrate 101 and the gate electrode 103. In this embodiment, a conductive film is formed over the substrate 101 and etched using a resist mask formed in a photolithography step.

Note that the side surfaces of the gate electrode 103 are preferably tapered for the following reason: an insulating film, a semiconductor film, and a wiring formed over the gate electrode 103 in later steps can be prevented from being cut in step portions of the gate electrode 103. In order to taper the side surfaces of the gate electrode 103, etching may be performed while the resist mask is made to recede.

In the step of forming the gate electrode 103, a gate wiring (a scan line) and a capacitor wiring can also be formed at the same time. Note that a scan line means a wiring which selects a pixel, and a capacitor wiring means a wiring which is connected to one of electrodes of a storage capacitor in a pixel. However, without limitation thereto, the gate electrode 103 and either or both of a gate wiring and a capacitor wiring may be formed separately.

The gate insulating film 105 can be formed as a single layer or a stacked layer using a silicon oxide film, a silicon oxynitride film, a silicon nitride film, a silicon nitride oxide film, an aluminum oxide film, an aluminum nitride film, an aluminum oxynitride film, and/or an aluminum nitride oxide film.

Note that silicon oxynitride means silicon that contains more oxygen than nitrogen. In the case where measurements are performed using Rutherford backscattering spectrometry (RBS) and hydrogen forward scattering (HFS), silicon oxynitride contains oxygen, nitrogen, silicon, and hydrogen at concentrations ranging from 50 to 70 at. %, 0.5 to 15 at. %, 25 to 35 at. %, and 0.1 to 10 at. %, respectively. Further, silicon nitride oxide means silicon that contains more nitrogen than oxygen, and in the case where measurements are conducted using RBS and HFS, silicon nitride oxide preferably contains oxygen, nitrogen, silicon, and hydrogen as composition ranging from 5 at. % to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %. By forming the gate insulating film 105 using an oxide insulating film such as a silicon oxide film or a silicon oxynitride film, fluctuation in the threshold voltage of the thin film transistor can be suppressed.

The gate insulating film 105 can be formed by a CVD method, a sputtering method, or the like. In a step of forming the gate insulating film 105 by a CVD method, glow discharge plasma is generated by using high-frequency power in the HF band with a frequency of 3 MHz to 30 MHz, typically 13.56 MHz or 27.12 MHz, or very-high-frequency power in the VHF band with a frequency of 30 MHz to approximately 300 MHz as appropriate. When the gate insulating film 105 is formed at a high frequency (1 GHz or more) using a microwave plasma CVD apparatus, the dielectric strength between the gate electrode and the drain and source electrodes can be improved, so that a highly reliable thin film transistor can be obtained.

Further, by forming a silicon oxide film as the gate insulating film 105 by a CVD method using an organosilane gas, the crystallinity of the semiconductor film which is formed later can be improved, so that the on-state current and field-effect mobility of the thin film transistor can be increased. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

The microcrystalline semiconductor film 109 is formed of a microcrystalline semiconductor. A microcrystalline semiconductor means a semiconductor having an intermediate structure between amorphous and crystalline structures (including a single crystal and a polycrystal). A microcrystalline semiconductor is a semiconductor having a third state that is stable in terms of free energy and is a crystalline semiconductor having short-range order and lattice distortion, in which columnar or needle-like crystal grain having a diameter of greater than or equal to 2 nm and less than or equal to 200 nm, preferably greater than or equal to 10 nm and less than or equal to 80 mm, further preferably greater than or equal to 20 nm and less than or equal to 50 nm grow in a normal direction with respect to the substrate surface. Therefore, a grain boundary is formed at the interface of the columnar or needle-like crystal grains in some cases. Note that the diameter of the grain here means the maximum diameter of a crystal grain in a plane parallel to the substrate surface.

The Raman spectrum of microcrystalline silicon, which is a typical example of a microcrystalline semiconductor, is located in lower wave numbers than 520 $cm^{-1}$, which represents a peak of the Raman spectrum of single crystal silicon. In other words, the peak of the Raman spectrum of the microcrystalline silicon exists between 520 $cm^{-1}$ which represents single crystal silicon and 480 $cm^{-1}$ which represents amorphous silicon. The microcrystalline semiconductor includes at least 1 at. % or more of hydrogen or halogen to terminate a dangling bond. The microcrystalline semiconductor may further include a rare gas element such as helium, neon, argon, krypton, or xenon to further promote lattice distortion, so that the stability is enhanced and a favorable microcrystalline semiconductor can be obtained. Such a microcrystalline semiconductor is disclosed in, for example, U.S. Pat. No. 4,409,134.

The microcrystalline semiconductor film 109 is formed by glow discharge plasma with a mixture of hydrogen and a deposition gas containing silicon in a reaction chamber of a plasma CVD apparatus. Alternatively, the microcrystalline semiconductor film 109 is formed by glow discharge plasma with a mixture of hydrogen, a deposition gas containing silicon, and a rare gas such as helium, neon, or krypton. Here, a microcrystalline silicon film is formed under the condition that the deposition gas containing silicon is diluted with hydrogen by setting the flow rate of hydrogen to the deposition gas at a flow rate 10 times to 2000 times, preferably 10 times to 200 times that of the deposition gas. Note that when a deposition gas containing germanium is used instead of the deposition gas containing silicon, a microcrystalline germanium film can be formed. When the deposition gas containing silicon and the deposition gas containing germanium are used, a microcrystalline silicon germanium film can be formed. The deposition temperature in this case is preferably 150° C. to 300° C., more preferably 150° C. to 280° C. The pressure in the reaction chamber and the distance between an upper electrode and a lower electrode may be set so that plasma can be generated.

When a rare gas such as helium, argon, neon, krypton, or xenon is used as a source gas of the microcrystalline semiconductor film 109, the deposition rate of the microcrystalline semiconductor film 109 is increased. Moreover, when the deposition rate is increased, the amount of impurities mixed in the microcrystalline semiconductor film 109 is reduced; thus, the crystallinity of the microcrystalline semiconductor film 109 can be improved.

Glow discharge plasma for forming the microcrystalline semiconductor film 109 can be generated in a manner similar to that of the gate insulating film 105.

Note that before the microcrystalline semiconductor film 109 is formed, a deposition gas containing silicon is introduced into the reaction chamber of the CVD apparatus while a gas in the reaction chamber is removed so that an impurity element in the reaction chamber is removed, in which case the amount of impurity elements in the microcrystalline semiconductor film 109 can be reduced. Before the microcrystalline semiconductor film 109 is formed, plasma may be generated in an atmosphere containing fluorine such as a fluorine atmosphere, a nitrogen fluoride atmosphere, or a silane fluoride atmosphere, and the gate insulating film 105 may be exposed to fluorine plasma.

Note that when the gate insulating film 105 is formed using a silicon nitride film, amorphous silicon is likely to be formed at the initial stage of deposition of the microcrystalline semiconductor film 109, which results in low crystallinity of the microcrystalline semiconductor film 109. Thus, the microcrystalline semiconductor film 109 is preferably formed under the condition that the dilution rate of the deposition gas containing silicon is high or under the low-temperature condition that the deposition temperature is 150° C. to 250° C. Typically, the high dilution rate condition that the flow rate of hydrogen is 200 times to 2000 times, preferably 250 times to 400 times that of the deposition gas containing silicon is preferable. In addition, the low-temperature condition that the temperature of the deposition of the microcrystalline semiconductor film 109 is 200° C. to 250° C. is preferable. When the high dilution rate condition or the low-temperature condition is employed, initial nucleation density is increased, amorphous silicon is not easily formed over the gate insulating film 105, and the crystallinity of the microcrystalline semiconductor film 109 is improved. Further, when the surface of the gate insulating film 105 formed using the silicon nitride film is oxidized, the adhesion between the gate insulating film 105 and the microcrystalline semiconductor film 109 is improved. As the oxidation treatment, exposure to an oxidizing gas, plasma treatment in an oxidation gas atmosphere, or the like can be used. Examples of the oxidation gas include oxygen, ozone, dinitrogen monoxide, water vapor, a mixed gas of oxygen and hydrogen, and the like.

The microcrystalline semiconductor film 109 may be formed gradually under different conditions in order to improve the crystallinity of the microcrystalline semiconductor film 109. Typically, seed crystals are formed under a first condition which allows the density of crystal grains to be low and the crystallinity of the crystal grains to be high, and then a microcrystalline semiconductor film is formed under a second condition which allows gaps between the seed crystals to be filled. An example of the first condition is a condition that a deposition gas containing silicon or germanium is diluted with hydrogen by setting the flow rate of hydrogen at a flow rate greater than or equal to 50 times and less than or equal to 1000 times that of the deposition gas and the pressure in the reaction chamber is greater than or equal to 67 Pa and less than or equal to 1333 Pa (greater than or equal to 0.5 Torr and less than or equal to 10 Torr). An example of the second condition is a condition that the deposition gas containing silicon or germanium is diluted with hydrogen by setting the flow rate of hydrogen at a flow rate greater than or equal to 100 times and less than or equal to 2000 times that of the deposition gas and the pressure in the reaction chamber is greater than or equal to 1333 Pa and less than or equal to 13332 Pa. Further, in the first condition or the second condition, the flow rate of the gas containing silicon or germanium or the flow rate of hydrogen may be periodically changed.

Figure 2B:
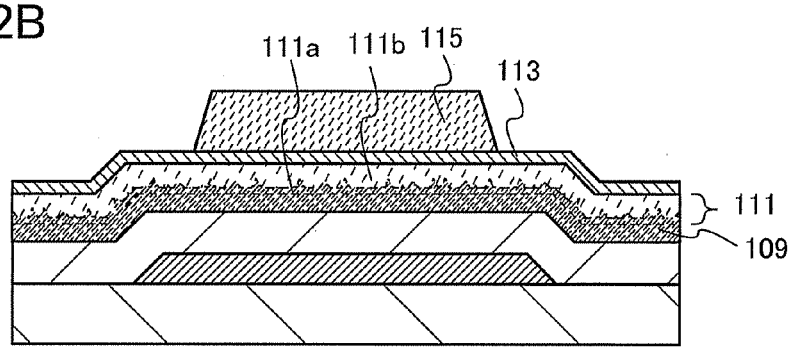

Next, as illustrated in FIG. 2B, a semiconductor film 111 is formed over the microcrystalline semiconductor film 109. The semiconductor film 111 includes a microcrystalline semiconductor region 111a and an amorphous semiconductor region 111b. Then, an impurity semiconductor film 113 is formed over the semiconductor film 111. Then, a resist mask 115 is formed over the impurity semiconductor film 113.

The semiconductor film 111 including the microcrystalline semiconductor region 111a and the amorphous semiconductor region 111b can be formed under such a condition that crystal growth is partly conducted (the crystal growth is suppressed) by using the microcrystalline semiconductor film 109 as a seed crystal.

The semiconductor film 111 is formed by glow discharge plasma with a mixture of a deposition gas containing silicon or germanium, hydrogen, and a gas containing nitrogen in a reaction chamber of the plasma CVD apparatus. Examples of the gas containing nitrogen include ammonia, nitrogen, nitrogen fluoride, nitrogen chloride, chloroamine, fluoroamine, and the like. Glow discharge plasma can be generated as in the case of the microcrystalline semiconductor film 109.

In that case, the condition that the flow ratio between the deposition gas containing silicon or germanium and hydrogen is the same as that for forming the microcrystalline semiconductor film 109 and a gas containing nitrogen is further used as the source gas is employed, whereby crystal growth can be suppressed as compared to the deposition condition of the microcrystalline semiconductor film 109. Specifically, since the gas containing nitrogen is contained in the source gas, the crystal growth is partly suppressed at the initial stage of the deposition of the semiconductor film 111; accordingly, a conical or pyramidal microcrystalline semiconductor region grows and an amorphous semiconductor region is formed. Further, at the middle stage or the later stage of the deposition, the crystal growth in the conical or pyramidal microcrystalline semiconductor region stops and only the amorphous semiconductor region is formed. As a result, in the semiconductor film 111, the microcrystalline semiconductor region 111a and the amorphous semiconductor region 111b which is formed using a well-ordered semiconductor film having fewer defects and a steep tail of a level at a band edge in the valence band can be formed.

Here, a typical example of the condition for forming the semiconductor film 111 is as follows: the flow rate of hydrogen is 10 times to 2000 times, preferably 10 times to 200 times that of the deposition gas containing silicon or germanium. Note that in a typical example of the condition for forming a normal amorphous semiconductor film, the flow rate of hydrogen is 0 to 5 times that of the deposition gas containing silicon or germanium.

By adding a rare gas such as helium, argon, neon, xenon, or krypton to the source gas of the semiconductor film 111, the deposition rate can be increased.

It is preferable that the thickness of the semiconductor film 111 be 50 nm to 350 nm, more preferably 120 nm to 250 nm.

Figure 3A:
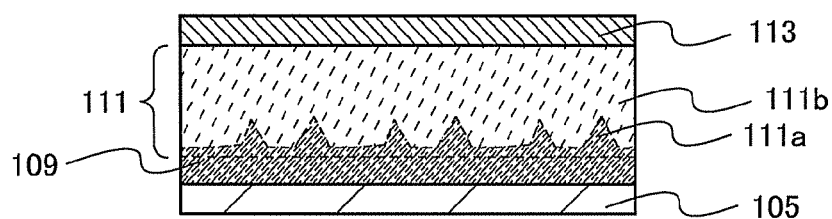
FIGS. 3A and 3B are cross-sectional views illustrating the manufacturing method of the semiconductor device according to one embodiment of the present invention.
Figure 3B:
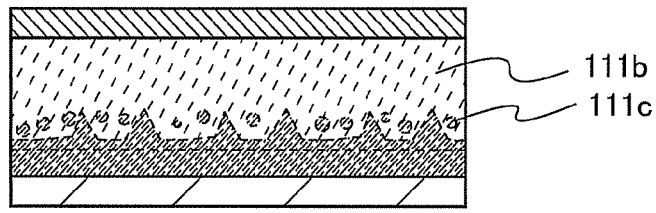

FIGS. 3A and 3B are enlarged views of the portion between the gate insulating film 105 and the impurity semiconductor film 113 which are illustrated in FIG. 2B.

As illustrated in FIG. 3A, the microcrystalline semiconductor region 111a in the semiconductor film 111 is uneven: the microcrystalline semiconductor region 111a has a projection (which has a conical or pyramidal shape) whose width decreases from the gate insulating film 105 side toward the amorphous semiconductor region 111b (i.e., the tip of the projection has an acute angle). Note that the microcrystalline semiconductor region 111a may have a projection (which has an inverted conical or pyramidal shape) whose width increases from the gate insulating film 105 side toward the amorphous semiconductor region 111b.

When the thickness of the microcrystalline semiconductor film 109 and the microcrystalline semiconductor region 111a, that is, the distance from the interface between the microcrystalline semiconductor film 109 and the gate insulating film 105 to the tip of the protrusion (projection) of the microcrystalline semiconductor region 111a is set to be greater than or equal to 5 nm and less than or equal to 310 nm, the off-state current of the thin film transistor can be reduced.

Further, in order to improve the crystallinity of the microcrystalline semiconductor region 111a, it is preferable that the concentration of oxygen contained in the semiconductor film 111, which are measured by secondary ion mass spectrometry, be lower than $1\times10^{18}$ atoms/cm$^3$. The nitrogen concentration profile of the semiconductor film 111 that is measured by secondary ion mass spectrometry has a peak concentration greater than or equal to $1\times10^{20}$ atoms/cm$^3$ and less than or equal to $1\times10^{21}$ atoms/cm$^3$, preferably greater than or equal to $2\times10^{20}$ atoms/cm$^3$ and less than or equal to $1\times10^{21}$ atoms/cm$^3$.

The amorphous semiconductor region 111b is formed of an amorphous semiconductor containing nitrogen. Nitrogen contained in the amorphous semiconductor containing nitrogen may exist, for example, as an NH group or an NH$_2$ group. The amorphous semiconductor is formed using amorphous silicon.

The amorphous semiconductor containing nitrogen is a semiconductor having a small amount of the defect absorption spectrum and low energy at an Urbach edge, measured by a constant photocurrent method (CPM) or photoluminescence spectroscopy, compared to a conventional amorphous semiconductor. In other words, as compared to the conventional amorphous semiconductor, the amorphous silicon containing nitrogen is a well-ordered semiconductor which has few defects and whose tail of a level at a valence band edge is steep. Since the amorphous semiconductor containing nitrogen has a steep tail of a level at a valence band edge, the band gap is wide and tunnel current does not flow easily. Therefore, when the amorphous semiconductor containing nitrogen is provided between the microcrystalline silicon region 111a and the impurity silicon film 113, the off-state current of the thin film transistor can be reduced. In addition, when the amorphous semiconductor containing nitrogen is provided, the on-state current and the field-effect mobility can be increased.

Further, the peak region of the spectrum of the amorphous semiconductor containing nitrogen, which is measured by low-temperature photoluminescence spectroscopy, is greater than or equal to 1.31 eV and less than or equal to 1.39 eV. Note that the peak region of a spectrum of a microcrystalline semiconductor, typically microcrystalline silicon, which is measured by low-temperature photoluminescence spectroscopy, is greater than or equal to 0.98 eV and less than or equal to 1.02 eV. Therefore, the amorphous semiconductor containing nitrogen is different from microcrystalline semiconductor.

The microcrystalline semiconductor region 111a as well as the amorphous semiconductor region 111b may include an NH group or an NH$_2$ group.

Further, as illustrated in FIG. 3B, a semiconductor crystal grain 111c whose grain size is greater than or equal to 1 nm and less than or equal to 10 nm, preferably greater than or equal to 1 nm and less than or equal to 5 nm included in the amorphous semiconductor region 111b, so that the on-state current and the filed-effect mobility can be further increased.

The microcrystalline semiconductor having a projection (which has a conical or pyramidal shape) whose width decreases from the gate insulating film 105 side toward the amorphous semiconductor region 111b or the microcrystalline semiconductor having a projection (which has an inverted conical or pyramidal shape) whose width increases from the gate insulating film 105 side toward the amorphous semiconductor region 111b is formed in the following manner: after the microcrystalline semiconductor film is formed under the condition which allows a microcrystalline semiconductor to be deposited, crystal growth is caused under the condition which allows the crystal growth to be partly conducted and an amorphous semiconductor is deposited.

Since the microcrystalline semiconductor region 111a in the semiconductor film 111 has the conical or pyramidal shape or the inverted conical or pyramidal shape, resistance in the vertical direction (film thickness direction) at the time when voltage is applied between the source and drain electrodes in an on state, i.e., the resistance of the semiconductor film 111 can be reduced. Further, less tunneling current flows by the provision of the amorphous semiconductor containing nitrogen between the microcrystalline semiconductor region 111a and the impurity semiconductor film 113 because the amorphous semiconductor is a well-ordered semiconductor which has fewer defects and whose tail of a level at a band edge in the valence band is steep. Thus, in the thin film transistor described in this embodiment, the on-state current and the field-effect mobility can be increased and the off-state current can be reduced.

Here, the semiconductor film 111 including the microcrystalline semiconductor region 111a and the amorphous semiconductor region 111b is formed using the source gas of the semiconductor film 111, in which a gas containing nitrogen is further contained. Alternatively, the semiconductor film 111 including the microcrystalline semiconductor region 111a and the amorphous semiconductor region 111b can be formed in the following manner: the surface of the microcrystalline semiconductor film 109 is exposed to a gas containing nitrogen so that nitrogen is adsorbed to the surface of the microcrystalline semiconductor film 109, and then deposition is performed using hydrogen and a deposition gas containing silicon or germanium as source gases.

The impurity semiconductor film 113 is formed using amorphous semiconductor to which phosphorus is added. Note that in the case of manufacturing a p-channel thin film transistor as the thin film transistor, the impurity semiconductor film 113 is formed using amorphous semiconductor to which boron is added, or the like.

The impurity semiconductor film 113 is formed, as described in Embodiment 1, in the following manner: hydrogen, phosphine (diluted with hydrogen or silane), and a deposition gas containing silicon are introduced into a reaction chamber in which the electrode distance and pressure with which the minimum discharge inception voltage can be obtained are maintained, and then pulse-modulated minimum discharge inception voltage is applied to the electrodes. Note that in the case of manufacturing a p-channel thin film transistor, diborane, instead of phosphine, may be used as a source gas of the impurity semiconductor film 113.

The resist mask 115 can be formed in a photolithography step.

Next, the microcrystalline semiconductor film 109, the semiconductor film 111, and the impurity semiconductor film 113 are etched using the resist mask 115. Through this step, the microcrystalline semiconductor film 109, the semiconductor film 111, and the impurity semiconductor film 113 are separated for each element, so that an island-shaped semiconductor stack 117 and an island-shaped impurity semiconductor film 121 are formed. Note that the semiconductor stack 117 includes part of the microcrystalline semiconductor film 109 and part of the semiconductor film 111. The semiconductor stack 117 is constituted of a microcrystalline semiconductor region 117a which includes part of the microcrystalline semiconductor film 109 and part of the microcrystalline semiconductor region of the semiconductor film 111 and an amorphous semiconductor region 117b which includes part of the amorphous semiconductor region of the semiconductor film 111. After that, the resist mask 115 is removed (see FIG. 2C).

Figure 2C:
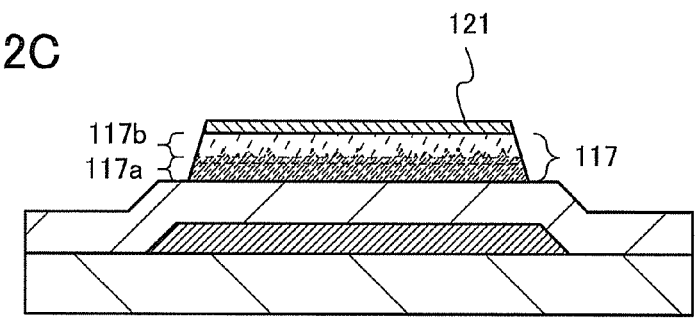

Note that after the step illustrated in FIG. 2C, plasma treatment for exposing the side surfaces of the semiconductor stack 117 to the plasma may be performed. Plasma may be generated in an oxidation gas atmosphere or a nitriding gas atmosphere so that the side surfaces of the semiconductor stack 117 are exposed to the plasma. Examples of the oxidation gas include oxygen, ozone, dinitrogen monoxide, water vapor, a mixed gas of oxygen and hydrogen, and the like. Examples of the nitriding gas include nitrogen, ammonia, nitrogen fluoride, nitrogen chloride, chloroamine, fluoroamine, and the like. By generating plasma in an oxidation gas or a nitriding gas, an oxygen radical or a nitrogen radical is generated. The radical reacts with the semiconductor stack 117, which forms an insulating region serving as a barrier region on the side surfaces of the semiconductor stack 117. By the plasma treatment, the exposed impurity semiconductor film 121 as well as the side surfaces of the semiconductor stack 117 are oxidized, so that an insulating region serving as a barrier region is formed on the side surfaces of the semiconductor stack 117 and the side surfaces and part of the top surface of the impurity semiconductor film 121.

The insulating region serving as a barrier region is preferably provided between a semiconductor stack 133 and wirings 129a and 129b which are formed later, in which case holes injected from the wirings 129a and 129b to the semiconductor stack 133 can be reduced and a thin film transistor having low off-state current, high on-state current, and high field-effect mobility can be obtained.

Figure 4A:
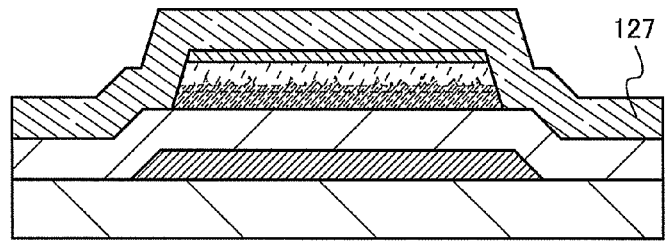
FIGS. 4A to 4C are cross-sectional views illustrating the manufacturing method of the semiconductor device according to one embodiment of the present invention.

Next, a conductive film 127 is formed over the impurity semiconductor film 121 (see FIG. 4A). The conductive film 127 can be formed as a single layer or a stacked layer using aluminum, copper, titanium, neodymium, scandium, molybdenum, chromium, tantalum, tungsten, and the like. An aluminum alloy to which an element for preventing a hillock is added (e.g., an Al—Nd alloy which can be used for the gate electrode layer 103) may also be used. Crystalline silicon to which an impurity element which serves as a donor is added may also be used. A stacked structure in which a film on the side that is in contact with the crystalline silicon to which an impurity element serving as a donor is added is formed using titanium, tantalum, molybdenum, tungsten, or a nitride of any of these elements, and a layer of aluminum or an aluminum alloy is formed thereover may also be formed. The conductive film 127 may also have a structure in which layers of titanium, tantalum, molybdenum, tungsten, or nitride of any of these elements are stacked with a layer of aluminum or an aluminum alloy interposed therebetween. The conductive film 127 is formed by a CVD method, a sputtering method, or a vacuum evaporation method. The conductive film 127 may be formed by discharging a conductive nanopaste of silver, gold, copper, or the like by a screen printing method, an inkjet method, or the like and baking the conductive nanopaste.

Figure 4B:
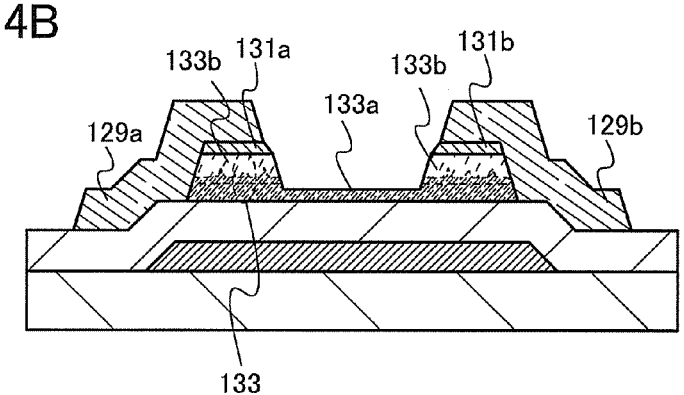

Next, a resist mask is formed in a photolithography step, and the conductive film 127 is etched using the resist mask, so that the wirings 129a and 129b functioning as a source electrode and a drain electrode are formed (see FIG. 4B). The etching of the conductive film 127 may be either dry etching or wet etching. Note that one of the wirings 129a and 129b functions as a signal line as well as the source electrode or the drain electrode. However, without limitation thereto, a signal line may be provided separately from the source and drain electrodes.

Next, parts of the impurity semiconductor film 121 and the semiconductor stack 117 are etched, so that a pair of impurity semiconductor films 131a and 131b functioning as ohmic contact regions is formed. In addition, the semiconductor stacks 133 including a microcrystalline semiconductor region 133a and a pair of amorphous semiconductor regions 133b are formed. At this time, the etching of the semiconductor stack 117 is performed so that the microcrystalline semiconductor region 133a is exposed, whereby the semiconductor stacks 133 are formed in which the microcrystalline semiconductor region 133a and the amorphous semiconductor regions 133b are stacked in regions which are covered with the wirings 129a and 129b, and the microcrystalline semiconductor region 133a is exposed in a region which is not covered with the wirings 129a and 129b but overlaps with the gate electrode.

Here, edges of the wirings 129a and 129b are aligned with the edges of the impurity semiconductor films 131a and 131b, respectively. However, the edges of the wirings 129a and 129b are not necessary to be aligned with the edges of the impurity semiconductor films 131a and 131b, respectively: in a cross section in such a case, the edges of the wirings 129a and 129b may be positioned on the inner side than the edges of the impurity semiconductor films 131a and 131b, respectively.

Next, dry etching may be performed. The dry etching condition is set such that the exposed microcrystalline semiconductor region 133a and the amorphous semiconductor region 133b are not damaged and the etching rates with respect to the microcrystalline semiconductor region 133a and the amorphous semiconductor region 133b are low. As an etching gas, $Cl_2$, $CF_4$, $N_2$, or the like is typically used. There is no particular limitation on an etching method and an inductively coupled plasma (ICP) method, a capacitively coupled plasma (CCP) method, an electron cyclotron resonance (ECR) method, a reactive ion etching (RIE) method, or the like can be used.

Next, the surfaces of the microcrystalline semiconductor region 133a and the amorphous semiconductor regions 133b are subjected to plasma treatment, typically, water plasma treatment, oxygen plasma treatment, ammonia plasma treatment, nitrogen plasma treatment, plasma treatment using a mixed gas of oxygen and hydrogen, or the like.

The water plasma treatment can be performed in such a manner that a gas containing water typified by water vapor ($H_2O$ vapor) as a main component is introduced into a reaction space and plasma is generated. After that, the resist mask is removed. The resist mask may be removed before the dry etching performed on the impurity semiconductor film 121 and the semiconductor stack 117.

As described above, after the microcrystalline semiconductor region 133a and the amorphous semiconductor region 133b are formed, the dry etching is additionally performed under the condition that the microcrystalline semiconductor region 133a and the amorphous semiconductor region 133b are not damaged, whereby an impurity such as a residue on the exposed microcrystalline semiconductor region 133a and amorphous semiconductor region 133b can be removed. Further, by performing the water plasma treatment after the dry etching, a residue of the resist mask can be removed and defects of the microcrystalline semiconductor region 133a can be reduced. By the plasma treatment, insulation between the source region and the drain region can be ensured; thus, in a completed thin film transistor, the off-state current can be reduced and variation in the electrical characteristics can be reduced.

A resist mask is formed over the conductive film 127 in a photolithography step, and the conductive film 127 is etched using the resist mask, so that the wirings 129a and 129b which function as the source and drain electrodes are formed. Next, the impurity semiconductor film 121 is etched, so that the pair of impurity semiconductor films 131a and 131b functioning as ohmic contact regions is formed. At this time, part of the semiconductor stack 117 is etched in some cases. Next, the resist mask is removed, and then the semiconductor stacks 133 including the microcrystalline semiconductor region 133a and the pair of amorphous semiconductor regions 133b may be formed by etching part of the semiconductor stack 117.

As a result, the microcrystalline semiconductor region 117a is covered with the amorphous semiconductor region 117b, and thus is prevented from being in contact with a resist stripper and a residue of the resist in the step of removing the resist mask. Further, after the resist mask is removed, the amorphous semiconductor region 117b is etched using the wirings 129a and 129b as masks, so that the microcrystalline semiconductor region 133a is exposed. Thus, the amorphous semiconductor region which is in contact with the resist stripper and the residue of the resist is not left in a back channel. Consequently, leakage current due to the resist stripper and the residue of the resist left in the back channel is not generated, which allows a further reduction in the off-state current of the thin film transistor.

Through the above steps, a single-gate thin film transistor can be manufactured. Moreover, a single-gate thin film transistor with low off-state current, high on-state current, and high field-effect mobility can be manufactured with high productivity.

Next, an insulating film 137 (also referred to as a second gate insulating film) is formed over the semiconductor stack 133 and the wirings 129a and 129b. The insulating film 137 can be formed in a manner similar to that of the gate insulating film 105.

Next, an opening (not illustrated) is formed in the insulating film 137 with the use of a resist mask formed in a photolithography step. Then, a back-gate electrode 139 (also referred to as a second gate electrode) is formed over the insulating film 137 (see FIG. 4C). Through the above steps, a dual-gate thin film transistor can be manufactured.

The back-gate electrode 139 can be formed in a manner similar to that of the wirings 129a and 129b. The back-gate electrode 139 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

Alternatively, the back-gate electrode 139 can be formed using a conductive composition containing a light-transmitting conductive polymer. The back-gate electrode 139 preferably has a sheet resistance of less than or equal to 10000 Ω/sq. and a light transmittance greater than or equal to 70% at a wavelength of 550 nm. Further, the resistivity of the conductive polymer contained in the conductive composition is preferably less than or equal to 0.1 Ω·cm.

As the conductive polymer, a so-called π-electron conjugated conductive polymer can be used. Examples of the π-electron conjugated conductive polymer include polyaniline and/or a derivative thereof, polypyrrole and/or a derivative thereof, polythiophene and/or a derivative thereof, and a copolymer of two or more of aniline, pyrrole, and thiophene and/or a derivative thereof.

The back-gate electrode 139 can be formed in the following manner: a thin film is formed using any of the above materials by a sputtering method and is etched using a resist mask that is formed in a photolithography step. Alternatively, the back-gate electrode 139 can be formed by application or printing of a composition containing a light-transmitting conductive polymer and baking of the conductive composition.

The back-gate electrode 139 can be formed in parallel to the gate electrode 103. In this case, potential applied to the back-gate electrode 139 and potential applied to the gate electrode 103 can be controlled independently. Thus, the threshold voltage of the thin film transistor can be controlled.

The back-gate electrode 139 can be connected to the gate electrode 103. In this case, potential applied to the back-gate electrode 139 and potential applied to the gate electrode 103 are equivalent. As a result, in the semiconductor film, regions in which carriers flow, that is, channel regions are formed on the gate insulating film 105 side and on the insulating film 137 side in the microcrystalline semiconductor region; thus, the on-state current of the thin film transistor can be increased.

The back-gate electrode 139 is not necessary to be connected to the gate electrode 103 but may be in a floating state. In this case, channels regions are formed on the gate insulating film 105 side and on the insulating film 137 side in the microcrystalline semiconductor region even when potential is not applied to the back-gate electrode 139; thus, the on-state current of the thin film transistor can be increased.

The back-gate electrode 139 may overlap with the wirings 129a and 129b with the insulating film 137 interposed therebetween.

In the single-gate thin film transistor and the dual-gate thin film transistor which are described in this embodiment, the amorphous semiconductor film which contains an impurity element and has low resistivity can be formed as an ohmic contact region. Thus, the on-state current and field-effect mobility of the thin film transistor can be increased. As a result, the area of the single-gate thin film transistor and the area of the dual-gate thin film transistor can be reduced, which allows higher integration in a semiconductor device. Further, when the thin film transistor described in this embodiment is used for a driver circuit of a display device, the size of the driver circuit can be decreased, which allows the frame of the display device to be narrowed.

Note that, although the semiconductor layer is provided between the microcrystalline semiconductor film and the ohmic contact region, a thin film transistor in which a semiconductor layer is not provided and an ohmic contact region which is in contact with a microcrystalline semiconductor film is provided may be manufactured.

Embodiment 3

In this embodiment, a manufacturing method of a thin film transistor formed in a semiconductor device that is one embodiment of the present invention will be described with reference to FIGS. 2A to 2C, FIGS. 4A to 4C, and FIG. 5. Steps illustrated in FIG. 5 correspond to those illustrated in FIG. 4B.

In a manner similar to that in Embodiment 2, through the steps illustrated in FIGS. 2A to 2C and FIG. 4A, the conductive film 127 is formed.

Figure 5:
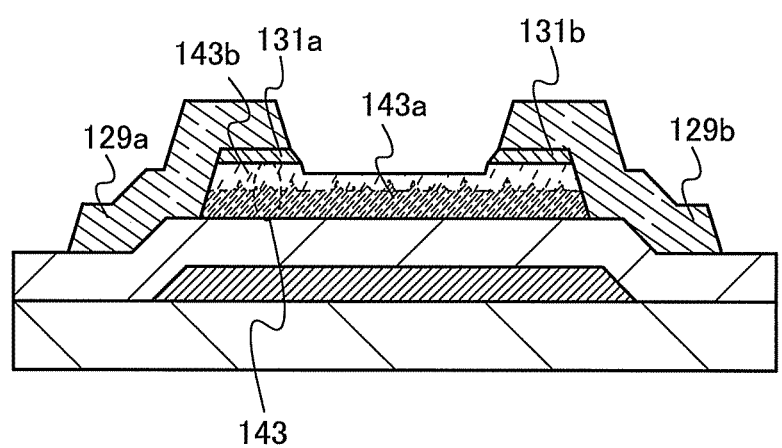
FIG. 5 is a cross-sectional view illustrating a manufacturing method of a semiconductor device according to one embodiment of the present invention.

Next, as illustrated in FIG. 5, in a manner similar to that in Embodiment 2, the wirings 129a and 129b are formed, and parts of the impurity semiconductor film 121 and the semiconductor stack 117 are etched, so that the pair of impurity semiconductor films 131a and 131b functioning as ohmic contact regions is formed. In addition, a semiconductor stack 143 including a microcrystalline semiconductor region 143a and an amorphous semiconductor region 143b is formed. At this time, by etching the semiconductor stack 117 so that the amorphous semiconductor region 143b is exposed, the semiconductor stack 143 is formed in which the microcrystalline semiconductor region 143a and the amorphous semiconductor regions 143b are stacked in regions which are covered with the wirings 129a and 129b, and the microcrystalline semiconductor region 143a is not exposed but the amorphous semiconductor region 143b is exposed in a region which is not covered with the wirings 129a and 129b but overlaps with the gate electrode. Note that the etching amount of the semiconductor stack 117 here is smaller than that of FIG. 4B.

The subsequent steps are similar to those in Embodiment 2.

Through the above steps, a single-gate thin film transistor can be manufactured. Since the back channel side of the thin film transistor is amorphous, the off-state current can be reduced as compared to the thin film transistor illustrated in FIG. 4B.

Figure 4C:
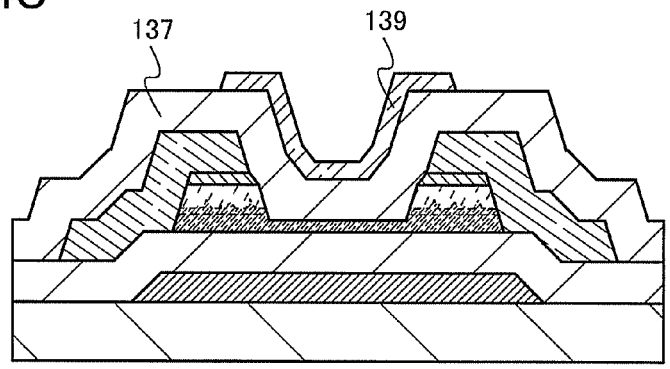

In this embodiment, after the steps illustrated in FIG. 5, the back-gate electrode 139 may be formed over the insulating film 137 as in the step illustrated in FIG. 4C.

This embodiment can be implemented in appropriate combination with any of the other embodiments.

Embodiment 4

A thin film transistor is manufactured, and a semiconductor device having a display function (also referred to as a display device) can be manufactured using the thin film transistor in a pixel portion and further in a driver circuit. Further, when part or whole of a driver circuit including a thin film transistor is formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC including a controller or the like is mounted on the panel. Furthermore, an element substrate, which corresponds to one embodiment before the display element is completed in a manufacturing process of the display device, is provided with a means for supplying current to the display element in each of a plurality of pixels. Specifically, the element substrate may be in a state in which only a pixel electrode of the display element is provided, a state after a conductive film to be a pixel electrode is formed and before the pixel electrode is formed by etching the conductive film, or any other states.

Note that a display device in this specification means an image display device, a display device, or a light source (including a lighting device). Further, the display device includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

Embodiment 5

In this embodiment, a photoelectric conversion device that is one embodiment of a semiconductor device will be described. In the photoelectric conversion device described in this embodiment, an amorphous semiconductor film which contains an impurity element and has low resistivity, which is described in Embodiment 1, is used as a semiconductor film having a conductivity type.

By employing the structure described above, resistance (series resistance) caused by the semiconductor film having a conductivity type can be reduced, resulting in improvement in the characteristics of the photoelectric conversion device. One embodiment of a manufacturing method of a photoelectric conversion device will be described with reference to FIGS. 6A to 6E.

Figure 6A:
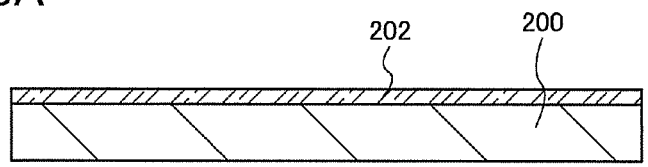
FIGS. 6A to 6E are cross-sectional views illustrating one embodiment of a manufacturing method of a photoelectric conversion device.

As illustrated in FIG. 6A, a first electrode 202 is formed over a substrate 200.

As the substrate 200, the substrate 101 described in Embodiment 1 can be used as appropriate. Alternatively, a plastic substrate can be used. As the plastic substrate, it is preferable to use a substrate containing a thermosetting resin such an epoxy resin, unsaturated polyester resin, a polyimide resin, a bismaleimide-triazine resin, or a cyanate resin, or a substrate containing a thermoplastic resin such as a poly (phenylene oxide) resin, a polyetherimide resin, or a fluorine resin.

Note that the substrate 200 may have a texture structure. Accordingly, photoelectric conversion efficiency can be improved.

In this embodiment, light enters from the back side (the lower side in the drawing) of the substrate 200; thus, a light-transmitting substrate is used. However, the present invention is not limited thereto in the case where light enters from the second electrode 210 side (the upper side in the drawing); in this case, a semiconductor substrate containing a material such as silicon or a conductive substrate containing a metal material or the like may be used.

The first electrode 202 can be formed using the light-transmitting conductive material used for the back-gate electrode 139 described in Embodiment 2. The first electrode 202 is formed by a sputtering method, a CVD method, a vacuum evaporation method, a coating method, a printing method, or the like.

The first electrode 202 is formed to a thickness of 10 nm to 500 nm, preferably 50 nm to 100 nm. The sheet resistance of the first electrode 202 is set to about 20 Ω/sq. to 200 Ω/sq.

In this embodiment, light enters from the back side (the lower side in the drawing) of the substrate 200; thus the first electrode 202 is formed using a light-transmitting conductive material. However, the present invention is not limited thereto in the case where light enters from the second electrode 210 side (the upper side in the drawing. In such a case, the first electrode 202 can be formed using a conductive material that does not have a light-transmitting property such as aluminum, platinum, gold, silver, copper, titanium, tantalum, or tungsten. In particular, when a material that easily reflects light, such as aluminum, silver, titanium, or tantalum, is used, photoelectric conversion efficiency can be sufficiently improved.

Like the substrate 200, the first electrode 202 may have a texture structure. An auxiliary electrode formed using a low-resistant conductive material may be separately formed so as to be in contact with the first electrode 202.

Figure 6B:
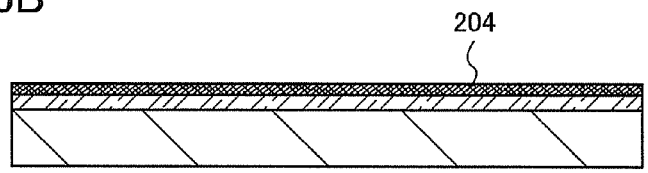

Next, as illustrated in FIG. 6B, a semiconductor film 204 having a first conductivity type is formed over the first electrode 202. The semiconductor film 204 having the first conductivity type is typically formed using a semiconductor film containing a semiconductor material to which an impurity element imparting a conductivity type is added. Silicon is suitable for the semiconductor material in terms of productivity, a price, or the like. In the case where silicon is used as the semiconductor material, phosphorus or arsenic, which imparts n-type conductivity, aluminum or boron, which imparts p-type conductivity, or the like is used as the impurity element imparting a conductivity type.

In this embodiment, light enters from the back side (the lower side in the drawing) of the substrate 200; thus, the conductivity type (first conductivity type) of the semiconductor film 204 having the first conductivity type is preferably p type. This is because, for example, the diffusion length of holes is short as a result of the lifetime of a hole which is as short as half that of an electron, and because more electrons and holes are formed on the side where light enters in a semiconductor film 206 having a function of photoelectric conversion. When the first conductivity type is p type as described above, current can be extracted before holes are annihilated, which makes it possible to suppress reduction in photoelectric conversion efficiency. Note that when there is no possibility of the above problems, for example, when the semiconductor film 206 having a function of photoelectric conversion is sufficiently thin, the first conductivity type may be an n type.

As other semiconductor materials which can be used for the semiconductor film 204 having the first conductivity type, there are silicon carbide, germanium, gallium arsenide, indium phosphide, zinc selenide, gallium nitride, and silicon germanium. Alternatively, a semiconductor material containing an organic material, a semiconductor material containing a metal oxide, or the like can be used. The material which can be used for the semiconductor film 204 having the first conductivity type can be selected as appropriate in consideration of the semiconductor film 206 having a function of photoelectric conversion.

Although there is no particular requirement for the crystallinity of the semiconductor film 204 having the first conductivity type, the amorphous semiconductor film which contains an impurity element and has low resistivity, which is described in Embodiment 1, is preferably formed as the semiconductor film 204 having the first conductivity type.

The semiconductor film 204 having the first conductivity type is formed as follows: hydrogen, diborane (diluted with hydrogen or silane), and a deposition gas containing silicon are supplied as source gases to a reaction chamber in which the electrode distance and pressure with which the minimum discharge inception voltage can be obtained are maintained, and pulse-modulated minimum discharge inception voltage is applied to the electrodes. Further, the semiconductor film 204 having the first conductivity type is formed to a thickness of 1 nm to 100 nm, preferably 5 nm to 50 nm.

Like the surface of the substrate 200, the semiconductor film 204 having the first conductivity type may have a texture structure.

Figure 6C:
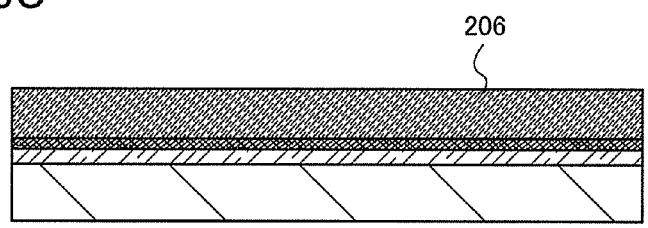

Next, as illustrated in FIG. 6C, the semiconductor film 206 having a function of photoelectric conversion is formed over the semiconductor film 204 having the first conductivity type. For the semiconductor film 206 having a function of photoelectric conversion, a semiconductor film using the semiconductor material which is the same as that of the semiconductor film 204 is used. In other words, as the semiconductor material, silicon, silicon carbide, germanium, gallium arsenide, indium phosphide, zinc selenide, gallium nitride, silicon germanium, or the like is used. In particular, silicon is preferably used. Alternatively, a semiconductor material containing an organic material, a semiconductor material containing a metal oxide, or the like can be used.

An amorphous semiconductor film, a microcrystalline semiconductor film, or a crystalline semiconductor film is used as the semiconductor film 206 having a function of photoelectric conversion as appropriate. Note that when a microcrystalline semiconductor film or crystalline semiconductor film which has improved crystallinity is used as the semiconductor film 206 having a function of photoelectric conversion, series resistance can be reduced and optical and electrical loss at an interface with another film can be suppressed.

Note that the semiconductor film 206 having a function of photoelectric conversion needs to exhibit sufficient light absorption, and thus preferably has a thickness of about 100 nm to 10 μm.

Figure 6D:
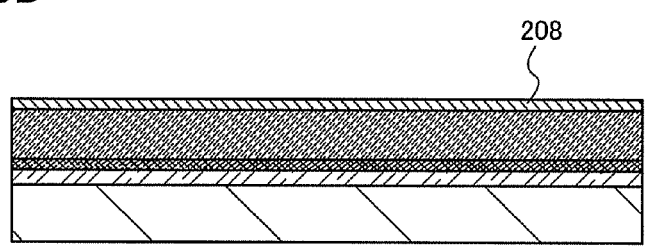

Next, as illustrated in FIG. 6D, a semiconductor film 208 having a second conductivity type is formed over the semiconductor film 206 having a function of photoelectric conversion. In this embodiment, the second conductivity type is an n type. The semiconductor film 208 having the second conductivity type can be formed using the amorphous semiconductor film which contains phosphorus and has low resistivity, which is described in Embodiment 1.

The semiconductor film 208 having the second conductivity type can be formed in a manner similar to that of the semiconductor film 204 having the first conductivity type. The semiconductor film 208 having the second conductivity type is formed in the following manner, for example: hydrogen, phosphine (diluted with hydrogen or silane), and a deposition gas containing silicon are supplied as source gases to a reaction chamber in which the electrode distance and pressure with which the minimum discharge inception voltage can be obtained are maintained, and then pulse-modulated minimum discharge inception voltage is applied to the electrodes.

In this embodiment, light enters from the back side (the lower side in the drawing) of the substrate 200; thus, the conductivity type (second conductivity type) of the semiconductor film 208 having the second conductivity type is preferably an n type. However, one embodiment of the disclosed invention is not limited thereto. In the case where the first conductivity type is an n type, the second conductivity type is a p type.

Figure 6E:
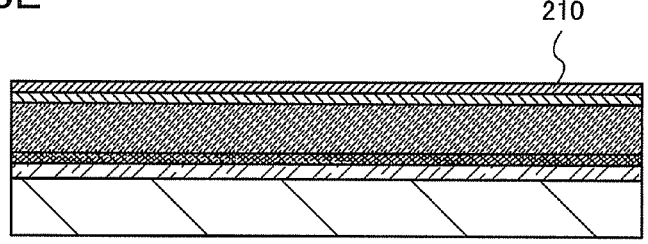

Next, as illustrated in FIG. 6E, a second electrode 210 is formed over the semiconductor film 208 having the second conductivity type. The second electrode 210 is formed using a conductive material such as metal. The second electrode 210 can be formed using, for example, a material that easily reflects light, such as aluminum, silver, titanium, or tantalum. Such a material that easily reflects light is preferably used, in which case light that has not been absorbed by the semiconductor film 206 can enter the semiconductor film 206, resulting in improvement in photoelectric conversion efficiency.

As examples of a formation method of the second electrode 210, a vacuum evaporation method, a CVD method, a coating method, a printing method, and the like are given. The second electrode 210 is formed to a thickness of 10 nm to 500 nm, preferably 50 nm to 100 nm.

In this embodiment, light enters from the back side (the lower side in the drawing) of the substrate 200; thus, the second electrode 210 is formed using a material that has no light-transmitting property. However, the structure of the second electrode 210 is not limited thereto. For example, when light enters from the second electrode 210 side (the upper side in the drawing), the second electrode 210 can be formed using any of the light-transmitting conductive materials for the first electrode 202.

An auxiliary electrode formed using a low-resistant conductive material may be formed so as to be in contact with the second electrode 210.

The method described above makes it possible to manufacture a photoelectric conversion device in which an amorphous semiconductor film which contains an impurity element and has low resistivity is used as either or both of the semiconductor film having the first conductivity type and the semiconductor film having the second conductivity type. Accordingly, the photoelectric conversion efficiency of the photoelectric conversion device can be increased.

Note that, although the photoelectric conversion device having one unit cell is described in this embodiment, a photoelectric conversion device in which two or more unit cells are stacked as appropriate can be provided.

This embodiment can be implemented in appropriate combination with the other embodiments.

Embodiment 6

A semiconductor device disclosed in this specification can be applied to electronic paper. Electronic paper can be used for electronic devices of a variety of fields as long as they can display data. Electronic paper can be applied to, for example, an electronic book (e-book) reader, a poster, a digital signage, a public information display (PID), an advertisement in a vehicle such as a train, displays of various cards such as a credit card, and the like. An example of the electronic devices is illustrated in FIG. 7.

Figure 7:
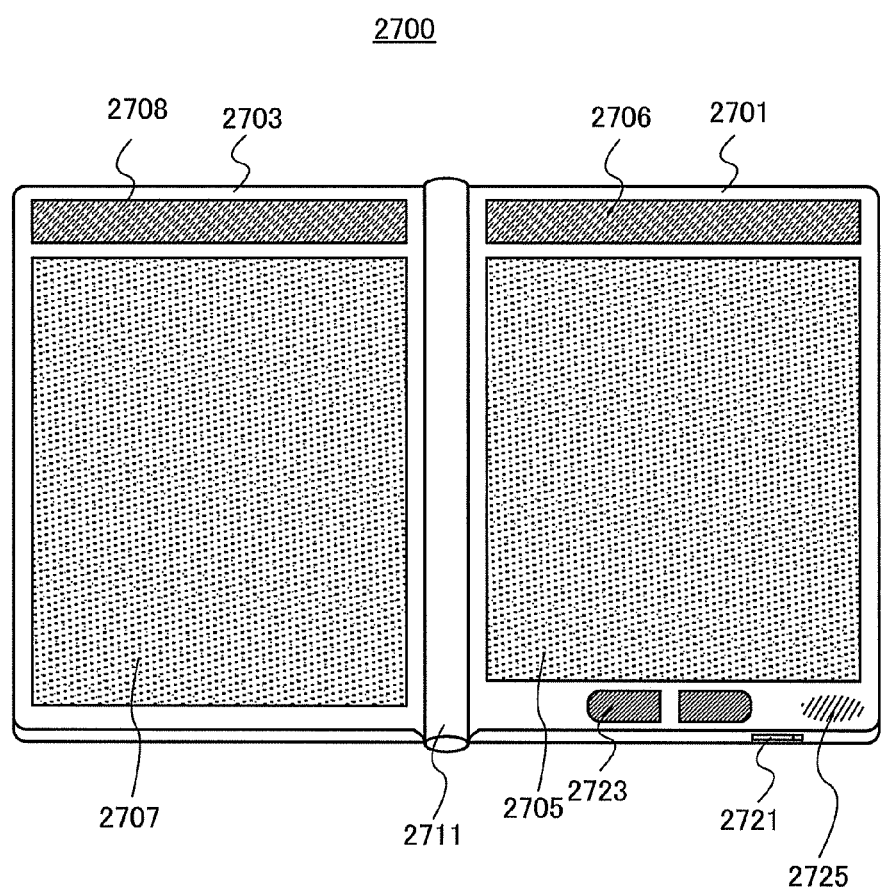
FIG. 7 is a perspective view illustrating an example of an e-book reader.

FIG. 7 illustrates an example of an e-book reader. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. Such a structure enables the e-book reader 2700 to operate like a paper book.

A display portion 2705 and a photoelectric conversion device 2706 are incorporated in the housing 2701. A display portion 2707 and a photoelectric conversion device 2708 are incorporated in the housing 2703. The display portion 2705 and the display portion 2707 may display one image or different images. When the display portions 2705 and 2707 display different images, for example, a display portion on the right side (the display portion 2705 in FIG. 7) can display text and a display portion on the left side (the display portion 2707 in FIG. 7) can display graphics.

FIG. 7 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may be provided on the surface of the housing, on which the display portion is provided. In addition, an external connection terminal (an earphone terminal, a USB terminal, a terminal that can be connected to an AC adapter or a variety of cables such as a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Embodiment 7

A semiconductor device disclosed in this specification can be applied to a variety of electronic devices (including game machines). Examples of the electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 8A:
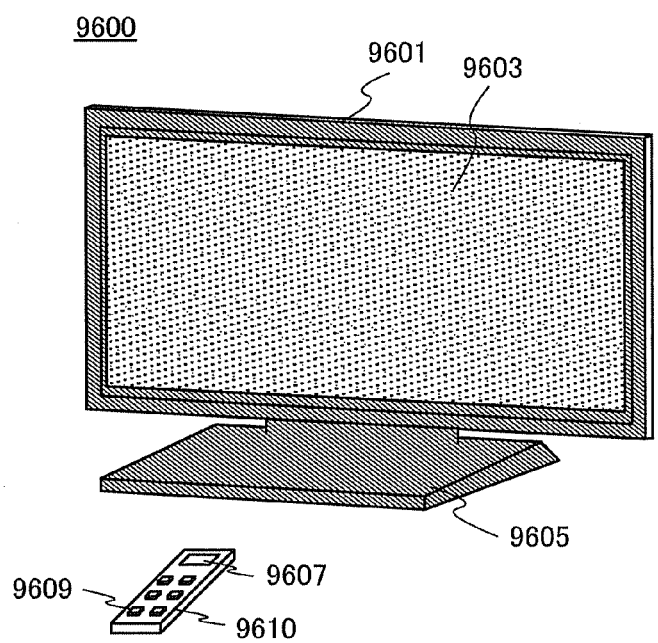
FIGS. 8A and 8B are perspective views illustrating examples of a television device and a digital photo frame, respectively.

FIG. 8A illustrates an example of a television set. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels can be switched and the volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 8B:
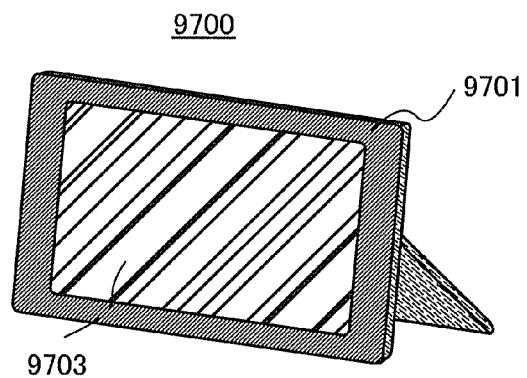

FIG. 8B illustrates an example of a digital photo frame. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may transmit and receive data wirelessly. Through wireless communication, desired image data can be transferred to be displayed.

Example 1

Figure 9A:
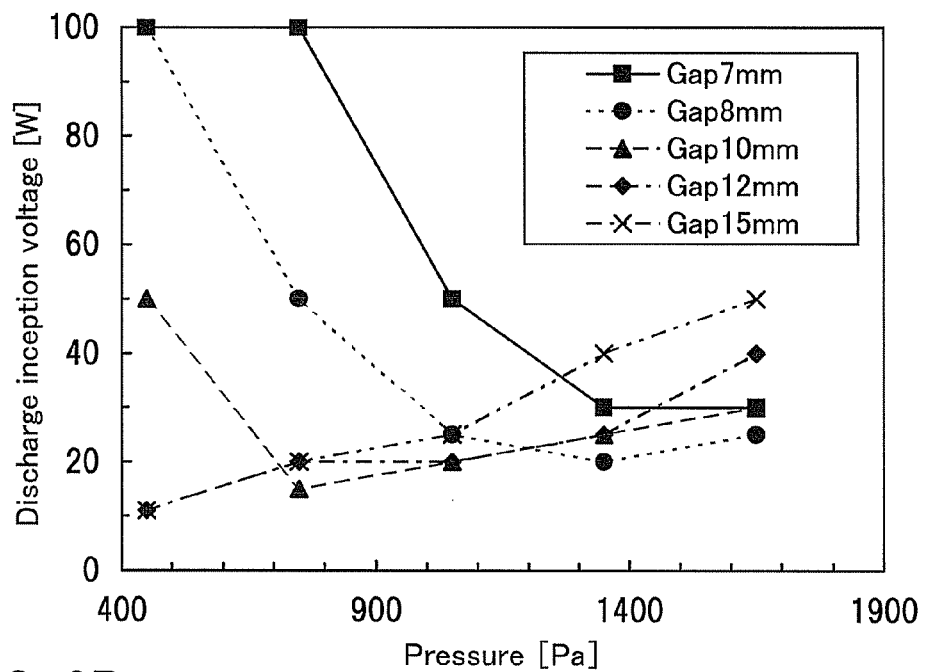
FIGS. 9A and 9B are graphs showing the relationship among the electrode distance, the voltage, and the discharge inception power.
Figure 9B:
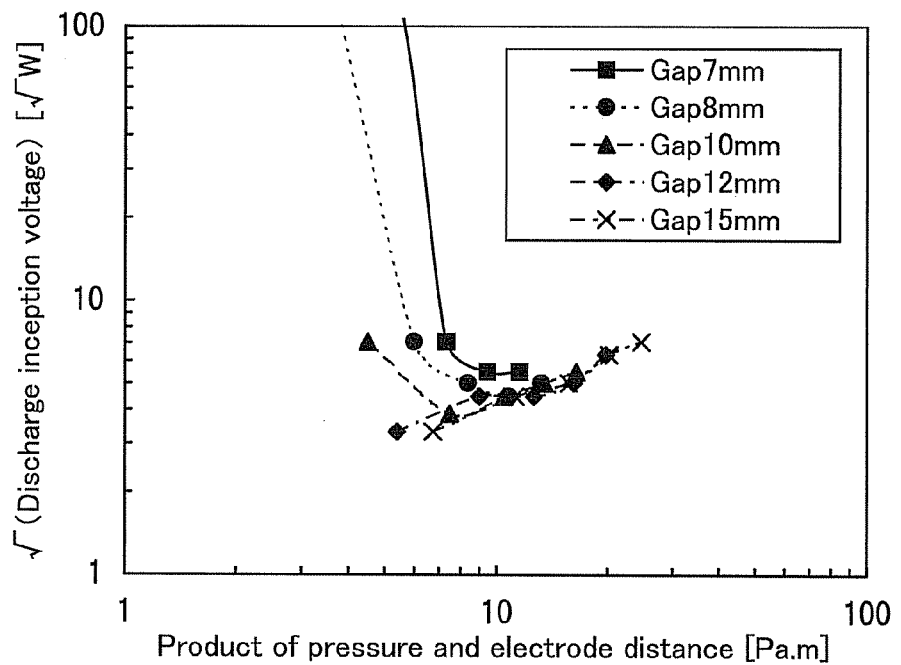
Figure 10:
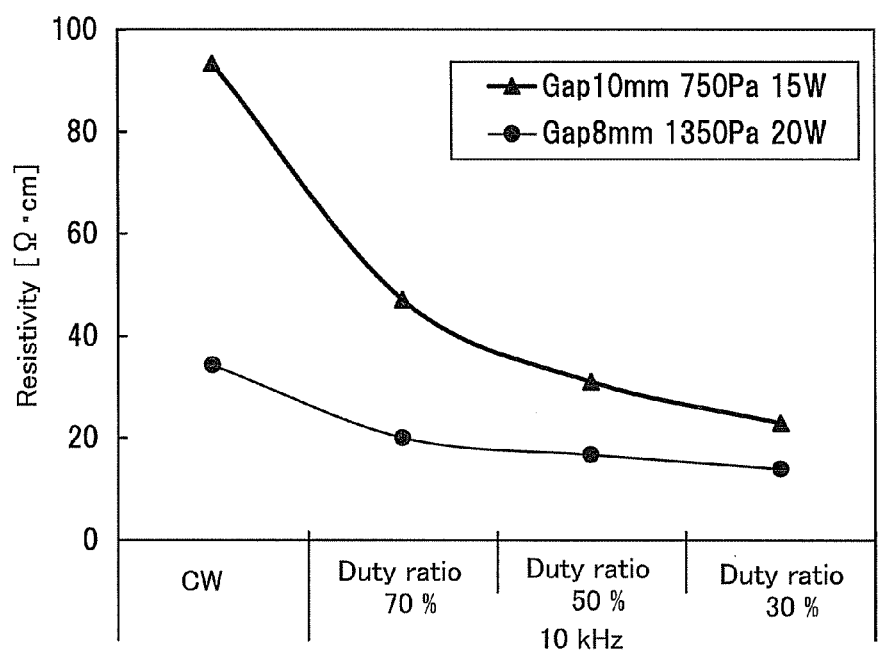
FIG. 10 is a graph showing the resistivity of an amorphous silicon film containing phosphorus.

In this example, the minimum discharge inception power under corresponding electrode distances was obtained by obtaining discharge inception power under corresponding pressure in a reaction chamber and electrode distances (see FIGS. 9A and 9B), and the resistivity of each impurity semiconductor film formed by applying pulse-modulated power to the electrodes under the conditions allowing the minimum discharge inception power was examined (see FIG. 10). Here, an amorphous silicon film containing phosphorus was formed as an amorphous semiconductor film containing an impurity element.

First, glow discharge was generated under each electrode distance and pressure and observation was conducted.

Here, discharge was generated under the conditions for depositing an amorphous silicon film containing phosphorus and observation was conducted. The deposition conditions for the amorphous silicon film containing phosphorus were as follows: silane, silane-diluted phosphine (5%), and hydrogen were introduced as source gases at flow rates of 82 sccm, 18 sccm, and 1400 sccm, respectively; the RF power source frequency was 13.56 MHz; the temperature of an upper electrode was 200° C.; and the temperature of a lower electrode was 300° C. Moreover, the electrode distance was set to be 7 mm, 8 mm, 10 mm, 12 mm, and 15 mm and the pressure in a reaction chamber was set to be 450 Pa, 750 Pa, 1050 Pa, 1350 Pa, and 1650 Pa. Power (discharge inception power) which allowed glow discharge to be generated was examined under each electrode distance and pressure.

FIG. 9A shows the relationship between the pressure and the discharge inception power under each electrode distance. In FIG. 9A, the horizontal axis indicates the pressure and the vertical axis indicates the discharge inception power; and a square represents the discharge inception power with an electrode distance of 7 mm under each pressure, a circle represents the discharge inception power with an electrode distance of 8 mm under each pressure, a triangle represents the discharge inception power with an electrode distance of 10 mm under each pressure, a diamond represents the discharge inception power with an electrode distance of 12 mm under each pressure, and a cross represents the discharge inception power with an electrode distance of 15 mm under each pressure. High-frequency power was applied to the electrodes here; thus, the vertical axis indicates the power.

FIG. 9B shows the relationship between the electrode distance, the pressure, and the discharge inception power, which are shown in FIG. 9A. In FIG. 9B, the horizontal axis indicates the product of the pressure and the electrode distance and the vertical axis indicates the square root of the discharge inception power. Note that the square root of power is substantially proportional to voltage; thus, the square root of the discharge inception power is indicated by the vertical axis.

According to FIG. 9A, when the electrode distance was 8 mm, the minimum discharge inception power was 20 W at a pressure in the reaction chamber of 1350 Pa. Moreover, when the electrode distance was 10 mm, the minimum discharge inception power was 15 W at a pressure in the reaction chamber of 750 Pa. The above results show that the minimum discharge inception voltage is obtained at an electrode distance of 8 mm and an electrode distance of 10 mm in the pressure range of 450 Pa to 1650 Pa.

Further, the curves in FIG. 9B show that Paschen's Law is satisfied under each pressure and electrode distance.

Next, amorphous semiconductor films containing an impurity element were each formed by applying pulse-modulated power or continuous-wave power to electrodes under 1350 Pa that is the pressure at which discharge inception power becomes minimum discharge inception power when the electrode distance is 8 mm; amorphous semiconductor films containing an impurity element were each formed by applying pulse-modulated power or continuous-wave power to electrodes under 750 Pa that is the pressure at which discharge inception power becomes minimum discharge inception power when the electrode distance is 10 mm. After that, the resistivity of each of the amorphous semiconductor films was measured. Here, amorphous silicon films containing phosphorus were each formed to a thickness of 200 nm as the amorphous semiconductor films containing an impurity element.

Each of the amorphous silicon films containing phosphorus was deposited by performing plasma discharge under Condition 1 or Condition 2 described below in addition to the following conditions: silane, silane-diluted phosphine (5%), and hydrogen were introduced as source gases at flow rates of 82 sccm, 18 sccm, and 1400 sccm, respectively; the RF power source frequency was 13.56 MHz; the temperature of an upper electrode was 200° C.; and the temperature of a lower electrode was 300° C.

Condition 1

Electrode distance: 8 mm, pressure in reaction chamber: 1350 Pa, applied power: 20 W Condition 2

Electrode distance: 10 mm, pressure in reaction chamber: 750 Pa, applied power: 15 W Discharge conditions for each of the amorphous silicon films containing phosphorus were as follows:

Continuous-wave (CW) discharge;

Discharge by pulse modulation in which the RF power source frequency in an on state and an off state is 10 kHz and the duty ratio is 70% (on time: 70 microseconds, off time: 30 microseconds);

Discharge by pulse modulation in which the RF power source frequency in an on state and an off state is 10 kHz and the duty ratio is 50% (on time: 50 microseconds, off time: 50 microseconds); and Discharge by pulse modulation in which the RF power source frequency in an on state and an off state is 10 kHz and the duty ratio is 30% (on time: 30 microseconds, off time: 70 microseconds).

FIG. 10 shows the resistivity of the amorphous silicon films containing phosphorus that were formed under the conditions described above. Note that a circle represents the resistivity of the amorphous silicon film containing phosphorus obtained under Condition 1 and a triangle represents the resistivity of the amorphous silicon film containing phosphorus obtained under Condition 2.

According to FIG. 10, it is found that the resistivity of the amorphous silicon film containing phosphorus that was formed by generating glow discharge by applying pulse-modulated power to the electrodes is lower than the resistivity of the amorphous silicon film containing phosphorus formed by continuous-wave discharge.

Thus, when the amorphous semiconductor film containing an impurity element is formed by glow discharge generated by applying the pulse-modulated power to the electrodes under the electrode distance and pressure with which the minimum discharge inception voltage can be obtained, the resistivity can be low.

This application is based on Japanese Patent Application serial no. 2010-151644 filed with the Japan Patent Office on Jul. 2, 2010, the entire contents of which are hereby incorporated by reference.

What is claimed is:

1. A manufacturing method of a semiconductor device, comprising the steps of:
    forming a gate electrode over a substrate;
    forming a gate insulating film over the substrate and the gate electrode;
    forming a microcrystalline semiconductor film over the gate insulating film;
    forming a semiconductor film comprising a microcrystalline semiconductor region and an amorphous semiconductor region, over the microcrystalline semiconductor film;
    forming an amorphous semiconductor film containing an impurity element, over the semiconductor film by a method comprising:
        introducing a mixture of a deposition gas containing silicon and a gas containing an impurity element as a source gas into a reaction chamber;
        setting pressure and an electrode distance in the reaction chamber so that a discharge inception voltage is a minimum discharge inception voltage in a Paschen curve; and
        applying a pulse-modulated discharge inception voltage to electrodes, wherein the pulse-modulated discharge inception voltage is obtained by pulse-modulating the discharge inception voltage, wherein the discharge inception voltage is pulse-modulated at a frequency higher than or equal to 1 kHz and lower than or equal to 12.5 kHz;
    forming an island-shaped amorphous semiconductor film containing the impurity element and an island-shaped first semiconductor stack, the island-shaped amorphous semiconductor film being formed by etching part of the amorphous semiconductor film, and the island-shaped first semiconductor stack being formed by etching parts of the microcrystalline semiconductor film and the semiconductor film;
    forming wirings functioning as a source electrode and a drain electrode, over the island-shaped amorphous semiconductor film; and
    forming a pair of amorphous semiconductor films containing the impurity element functioning as a source region and a drain region by etching the island-shaped amorphous semiconductor film;
    the method manufacturing method, further comprising the steps of:
    forming a second semiconductor stack in which a microcrystalline semiconductor region and a pair of amorphous semiconductor regions are stacked, by etching part of the island-shaped first semiconductor stack;
    forming an insulating film over the wirings, the pair of amorphous semiconductor films containing the impurity element, the second semiconductor stack, and the gate insulating film; and
    forming a back-gate electrode over the insulating film.

2. The manufacturing method according to claim 1, further comprising the step of exposing a side surface of the island-shaped first semiconductor stack to plasma before forming the wirings, so that a barrier region is formed on the side surface of the island-shaped first semiconductor stack.

3. The manufacturing method according to claim 1, wherein the gate electrode and the back-gate electrode are parallel to each other.

4. The manufacturing method according to claim 1, wherein the gate electrode and the back-gate electrode are connected to each other.

5. The manufacturing method according to claim 1, wherein the back-gate electrode is in a floating state.

6. The manufacturing method according to claim 1, wherein the source gas further comprises hydrogen.

* * * * *